(12) United States Patent
Okano (10) Patent No.: US 7,589,317 B2
(45) Date of Patent: Sep. 15, 2009

(54) OPTICAL ENCODER HAVING LENS INTEGRALLY MOLDED WITH HOUSING

(75) Inventor: Kazuaki Okano, Kashihara (JP)

(73) Assignee: Sharp Kabushiki Kaisha, Osaka-shi, Osaka (JP)

(*) Notice: Subject to any disclaimer, the term of this patent is extended or adjusted under 35 U.S.C. 154(b) by 71 days.

(21) Appl. No.: 11/892,909

(22) Filed: Aug. 28, 2007

(65) Prior Publication Data
US 2008/0054170 A1 Mar. 6, 2008

(30) Foreign Application Priority Data
Aug. 29, 2006 (JP) ............... 2006-231504
Jan. 12, 2007 (JP) ............... 2007-004146

(51) Int. Cl.
*H01J 5/02* (2006.01)
(52) U.S. Cl. .................. 250/239; 250/231.13
(58) Field of Classification Search ............... 250/239, 250/231.13, 221; 341/12–15
See application file for complete search history.

(56) References Cited
U.S. PATENT DOCUMENTS 4,553,033 A * 11/1985 Hubble et al. ............... 250/353
4,654,525 A    3/1987 Ebina et al.
5,317,149 A    5/1994 Uebbing et al.
6,855,886 B2 * 2/2005 Kawamura et al. .......... 174/357

FOREIGN PATENT DOCUMENTS

| JP | 63-170710 U | 11/1988 |
|----|-------------|---------|
| JP | 64-10620 U  | 1/1989  |
| JP | 3-76428 B2  | 12/1991 |
| JP | 6-221874 A  | 8/1994  |
| JP | 2001-228441 A | 8/2001 |
| JP | 2005-189446 A | 7/2005 |

* cited by examiner

*Primary Examiner*—Que T Le
(74) *Attorney, Agent, or Firm*—Birch, Stewart, Kolach and Birch, LLP (57) ABSTRACT

An optical encoder is comprised of three component parts, which are an emission-side light-pervious resin 6 by which a light emitting chip 1 is sealed, a reception-side light-pervious resin 8 by which a light receiving chip 2 is sealed, and an outer casing 4 to which a lens 3 is integrated and in which the emission-side light-pervious resin 6 and the reception-side light-pervious resin 8 are housed. Thus, the optical encoder can be reduced in parts count, allowing the development cost to be reduced, as compared with the case where the lens 3 for collimating light derived from the light emitting chip 1 and the outer casing 4 are provided as independent component parts.

16 Claims, 6 Drawing Sheets

OPTICAL ENCODER HAVING LENS INTEGRALLY MOLDED WITH HOUSING

This nonprovisional application claims priority under 35 U.S.C. §119(a) on Patent Application Nos. 2006-231504 and 2007-004146 filed in Japan on Aug. 29, 2006 and Jan. 12, 2007, respectively, the entire contents of which are hereby incorporated by reference.

BACKGROUND OF THE INVENTION

The present invention relates to an optical encoder, as well as electronic equipment using the same, in which light emitted from a light emitting element is applied to a detection object and then light transmitted by the detection object or light reflected by the detection object is detected by a light receiving element.

Conventionally, JP 3-76428 B discloses an optical encoder in which with a light emitting element and a light receiving element provided, light from the light emitting element, passing through a slit, is detected by the light receiving element, and an optical signal detected by the light receiving element is converted into an electric signal, so that passing velocity and passing direction of the slit are determined based on the electric signal.

However, in the conventional optical encoder, an outer casing for fixing each of the light emitting element and the light receiving element and a lens for collimating light emitted from the light emitting element are provided by different component parts. This causes a problem that the number of component parts constituting the optical encoder increases, which causes a cost increase.

Also, if the lens is provided with a birefringence function or a lens aberration improvement function, the parts count increases accordingly, causing a further cost increase as another problem.

Furthermore, in the conventional optical encoder, light emitted from the light emitting element is collimated by the lens and passed through a dark-and-bright pattern provided by the slit so as to be detected by the light receiving element. However, there are some cases where the distance between the light emitting element and the light receiving element more or less differs from a reference value, or where the resolution more or less differs from a reference value, so that incidence characteristics of light onto the light receiving element becomes unstable because of the collimation of light, as a further problem.

SUMMARY OF THE INVENTION

Accordingly, an object of the present invention is to provide an optical encoder, as well as electronic equipment using the same, which allows its parts count to be reduced so that its development cost can be reduced.

A further object of the invention is to provide an optical encoder, as well as electronic equipment using the same, which is capable of stabilizing incidence characteristics of light onto the light receiving element even if the distance between the light emitting element and the light receiving element is deviated from a reference value or if the resolution is deviated from a reference value.

In order to accomplish the above objects, there is provided an optical encoder comprising:

a light emitting element;

a light receiving element for receiving light derived from the light emitting element and transmitted or reflected by a detection object;

a lens for applying the light, which has been emitted from the light emitting element, to the detection object; and a casing for housing therein the light emitting element and the light receiving element and fixing the light emitting element and the light receiving element to specified positions, wherein the casing and the lens are integrally molded by a light-pervious resin.

According to this structure, the casing for fixing the light emitting element and the light receiving element to specified positions and the lens for applying the light, which has been emitted from the light emitting element, to the detection object are integrally molded by a light-pervious resin. Therefore, the optical encoder can be reduced in parts count, allowing the development cost to be reduced, as compared with the case where the lens and the casing are provided as Independent component parts.

In one embodiment, the light receiving element receives the light derived from the light emitting element and transmitted by the detection object, the light emitting element is sealed by an emission-side light-pervious resin, the light receiving element is sealed by a reception-side light-pervious resin, and the casing includes a box member housing therein the emission-side light-pervious resin and a box member housing therein the reception-side light-pervious resin.

In this embodiment, the optical encoder is made up of three component parts, which are the emission-side light-pervious resin by which the light emitting chip is sealed, the reception-side light-pervious resin by which the light receiving chip is sealed, and the outer casing to which the lens is integrated and in which the emission-side light-pervious resin and the reception-side light-pervious resin are housed. Therefore, the optical encoder can be reduced in parts count.

In one embodiment, the lens makes the light, which has been emitted from the light emitting element, formed into parallel light and applied to the detection object.

In this embodiment, since the light is collimated by the lens, diffusion of light can be suppressed. Therefore, in particular, even if the distance between the light emitting element and the light receiving element is longer than a reference value, incidence of disturbance light other than parallel rays onto the effective light receiving surface can be suppressed by virtue of a synergistic effect of the collimation of light by the lens and the collimation of light by the lengthened distance from the light emitting surface of the light emitting element to the light receiving surface of the light receiving element. As a consequence, incidence characteristics of light onto the light receiving element can be stabilized.

In one embodiment, the lens makes the light, which has been emitted from the light emitting element, formed into converging light and applied to the detection object.

In this embodiment, since the light is made to converge onto the effective light receiving surface of the light receiving element by the lens, diffusion of light can be suppressed. Further, the light condensing ratio can be improved, making it possible to achieve a performance improvement. In particular, even if the distance between the light emitting element and the light receiving element is shorter than a reference value, incidence of disturbance light onto the effective light receiving surface is suppressed. Consequently, incidence characteristics of light onto the light receiving element can be stabilized.

In one embodiment, the lens makes the light, which has been emitted from the light emitting element, formed into diffused light and applied to the detection object.

In this embodiment, since the light is diffused by the lens, the effective light receiving surface of the light receiving element can be irradiated uniformly with light even if the resolution of the light receiving element is lower than a reference value. Therefore, incidence characteristics of light onto the light receiving element can be stabilized.

In one embodiment, the lens has a cylindrical lens portion having a cylindrical shape.

In this embodiment, since the lens is cylindrical shaped, the molding dies for integral molding of the casing and the lens with the light-pervious resin can be simplified in structure. Therefore, the molding cost can be reduced.

In one embodiment, the lens has a hemispherical lens portion having a hemispherical shape formed integrally with at least one of both ends of the cylindrical lens portion.

In this embodiment, the hemispherical lens portion having a hemispherical shape is formed integrally with at least one of both ends of the cylindrical lens portion of the lens. Therefore, light emitted from the light emitting element can be condensed also by the hemispherical lens portion, so that the light condensing ratio by the lens can be improved, making it possible to achieve a performance improvement.

In one embodiment, around the lens, an inclined portion is provided, the inclined portion being so inclined as to lower toward the lens, and functioning to refract its incident light toward a direction in which the light goes away from an optical axis of the lens so that the light is led to go away from the optical axis, and further functioning to refract its outgoing light toward a direction in which the light goes further away from the optical axis.

In this embodiment, since the incident light is outputted by the inclined portion provided around the lens toward a direction in which the light goes away from the optical axis of the lens, effective light alone out of the light emitted from the light emitting element can be collimated so that scattering of light or occurrence of aberrations in outer peripheral portions of the lens can be reduced.

In one embodiment, the casing with which the lens is integrally molded is formed from a light-pervious resin that allows only light of a particular wavelength to be transmitted therethrough.

In this embodiment, by setting the particular wavelength to a wavelength of light emitted from the light emitting element, any effects of disturbance light that is transmitted by the casing to come in can be reduced.

In one embodiment, the light emitting element is sealed by a light-pervious resin, and a second lens for condensing light emitted from the light emitting element is integrally molded with one surface, through which the light emitted from the light emitting element passes, of the light-pervious resin by which the light emitting element is sealed.

In this embodiment, since the second lens integrally molded to the light-pervious resin by which the light emitting element is sealed and the lens integrally molded to the casing are combined together, a birefringent surface can be provided. Thus, light emitted from the light emitting element can be collimated with simplicity.

In one embodiment, the lens integrally molded to the casing is provided at least one in quantity.

In this embodiment, since the at least one lens integrally molded with the casing are provided, the light emitted from the light emitting element can be collimated with more simplicity. Further, in this case, by taking into consideration the direction and placement of the at least one lens integrally molded with the casing, it becomes possible to achieve an improvement of aberration.

In one embodiment, the casing is so arranged that in addition to having the integrally molded at least one lens, another lens can be additionally inserted from outside.

In this embodiment, for example, a concave lens that cancels aberrations is inserted from outside to between the at least one lens, e.g. two lenses integrally molded with the casing. Thus, the effects of aberrations can be further reduced, so that the light emitted from the light emitting element can be collimated with more simplicity.

In one embodiment, the casing is so arranged that in addition to having the integrally molded at least one lens, a slit can be additionally inserted from outside.

In this embodiment, for example, a slit through which only light close to and parallel to the optical axis out of the light emitted from the light emitting element is allowed to be incident on the succeeding-stage lens is inserted from outside to between the at least one lens, e.g. two lenses integrally molded with the casing. Thus, the light emitted from the light emitting element can be collimated with more simplicity, so that a telecentric optical system can be made up.

According to another aspect of the present invention, there is provided electronic equipment including the above optical encoder.

In this case, the electronic equipment uses the optical encoder which allows parts count to be reduced and therefore the development cost to be reduced. Thus, there can be provided the electronic equipment such as optical coupling devices which are smaller in parts count and lower in price.

As apparent from the above description, the optical encoder of the invention, in which the lens for applying light emitted from the light emitting element to a detection object and the casing for housing and fixing therein the light emitting element and the light receiving element are integrally molded by a light-pervious resin, can be reduced in parts count and therefore reduced in development cost.

Further, when the lens is formed so as to have a cylindrical lens portion having a cylindrical shape, the molding dies for integral molding of the casing and the lens can be simplified in structure. Therefore, the molding cost can be reduced.

Further, when the casing to which the lens is integrally molded is formed from a light-pervious resin that allows only light of a particular wavelength to pass therethrough, effects of disturbance light that is transmitted by the casing to come in can be reduced by setting the particular wavelength to a wavelength of light emitted from the light emitting element.

Further, when the second lens is integrally molded with the light-pervious resin by which the light emitting element is sealed, or when the lens integrally molded to the casing is provided in plurality, or when the casing is so arranged as to allow another lens or a slit to be additionally inserted from outside, the light emitted from the light emitting element can be collimated with more simplicity.

Further, when the lens is so arranged that light emitted from the light emitting element is formed into parallel rays and applied to the detection object, diffusion of light can be suppressed. In particular, even if the distance between the light emitting element and the light receiving element is longer than a reference value, incidence of disturbance light onto the effective light receiving surface of the light receiving element can be suppressed. Consequently, incidence characteristics of light onto the light receiving element can be stabilized.

Further, when the lens is so arranged that light emitted from the light emitting element is formed into converging light and applied to the detection object, diffusion of light can be suppressed. In particular, even if the distance between the light emitting element and the light receiving element is shorter than a reference value, incidence of disturbance light onto the effective light receiving surface can be suppressed. Consequently, incidence characteristics of light onto the light receiving element can be stabilized.

Further, when the lens is so arranged that light emitted from the light emitting element is formed into diffused light and applied to the detection object, the effective light receiving surface of the light receiving element can be irradiated uniformly with light even if the resolution of the light receiving element is lower than a reference value. Consequently, incidence characteristics of light onto the light receiving element can be stabilized.

Also, the electronic equipment of the invention uses an optical encoder which allows the parts count to be reduced and therefore the development cost to be reduced. Thus, there can be provided electronic equipment such as optical coupling devices which are smaller in parts count and lower in price.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Hereinbelow, the present invention will be described in detail by way of embodiments thereof illustrated in the accompanying drawings.

First Embodiment

Figure 1:
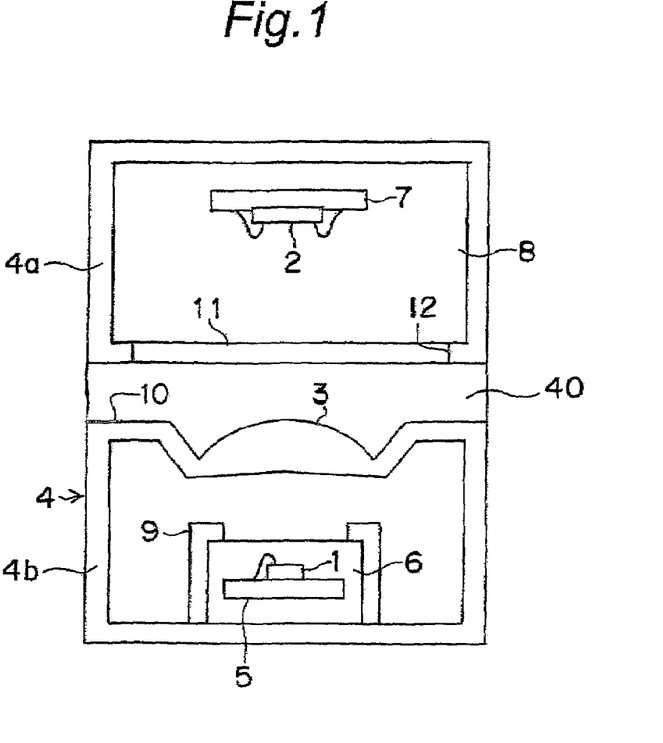
FIG. 1 is a longitudinal sectional view showing a schematic construction of an optical encoder according to the present invention.

FIG. 1 is a longitudinal sectional view showing a schematic construction of an optical encoder according to this embodiment.

As shown in FIG. 1, the optical encoder of this embodiment is a transmission encoder for detecting rotational speed, rotational direction, rotational position and the like of a disc that passes across a light passage. This transmission encoder is comprised roughly of a light emitting chip 1 implemented by a chip of a light emitting element such as a light emitting diode (LED), a lens 3 for collimating light emitted from the light emitting chip 1, a light receiving chip 2 provided by a chip of a light receiving element for receiving light obtained via the disc (not shown), and an outer casing 4 for housing therein the light emitting chip 1 and the light receiving chip 2 in opposition to each other with a disc passage interposed therebetween.

The light emitting chip 1 is mounted on a top of an emission-side lead frame 5 and sealed and molded by a light-pervious resin (emission-side light-pervious resin) 6. The light receiving chip 2, having a light receiving element provided by a multi-element photodiode (PD), is mounted on a surface of a reception-side lead frame 7 and sealed and molded by a light-pervious resin (reception-side light-pervious resin) 8. The outer casing 4, which is so configured that two box members are coupled to each other with a specified space as a disc passage provided therebetween, is formed from a light-transmitting resin. Then, the emission-side light-pervious resin 6 is engaged by an engagement member 9 to one inner surface of one 4b of the box members 4a and 4b in the outer casing 4 wherein the inner surface is opposite to a side on which the disc passage 40 is provided. The reception-side light-pervious resin 8 is housed in the other 4a of the box members 4a and 4b in the outer casing 4. In this way, the light emitting chip 1 and the light receiving chip 2 can be arranged via the disc passage 40 provided therebetween, and moreover it becomes possible to detect the rotational speed, rotational direction, rotational position and the like of the disc even if the light receiving elements have different light reception pitches.

Also, the lens 3 is molded integrally with a wall portion 10 that defines the disc passage in the box member 4b for housing the emission-side light-pervious resin 6 in the outer casing 4. Then, light emitted from the light emitting chip 1 is transmitted by the lens 3 integrally molded with the wall portion 10 of the outer casing 4, traveling onward as parallel rays of light. Parallel light outputted from the lens 3 passes through an opening 12 provided in one wall portion 11 of the box member 4a that houses therein the reception-side light-pervious resin 8 in the outer casing 4 and that confronts the lens 3, the light then traveling toward the light receiving chip 2.

As shown above, the optical encoder of this embodiment is made up of three component parts, which are the emission-side light-pervious resin 6 by which the light emitting chip 1 is sealed, the reception-side light-pervious resin 8 by which the light receiving chip 2 is sealed, and the outer casing 4 to which the lens 3 is integrated and in which the emission-side light-pervious resin 6 and the reception-side light-pervious resin 8 are housed. Thus, the optical encoder can be reduced in parts count, allowing the development cost to be reduced, as compared with the case where the lens 3 for collimating light derived from the light emitting chip 1 and the outer casing 4 are provided as independent component parts.

Figure 2:
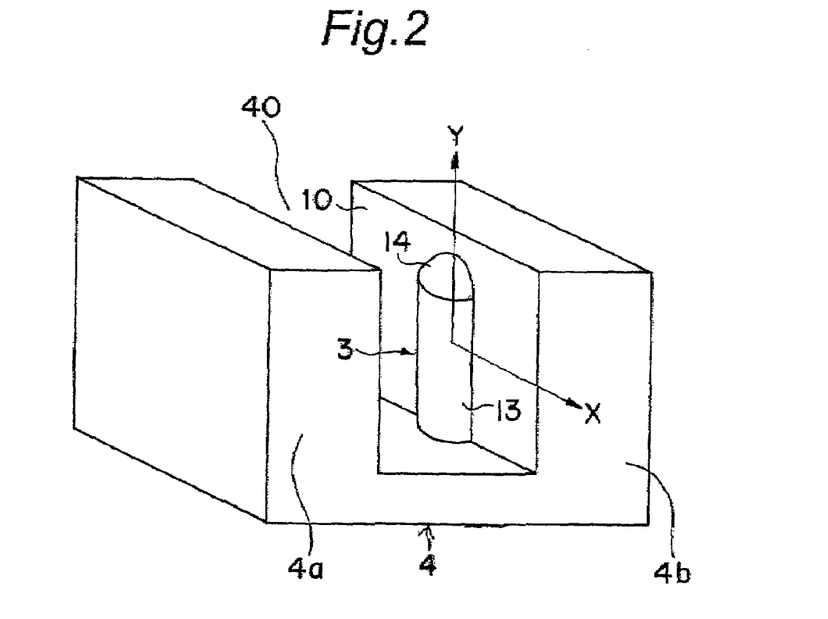
FIG. 2 is a perspective view showing a configuration of a lens in FIG. 1.

In this embodiment, the lens 3 is so shaped that, as shown in FIG. 2, a hemispherical lens portion 14 having a hemispherical shape is integrated to one end of a cylindrical lens portion 13 having a cylindrical shape. Forming the lens 3 into a cylindrical shape like this makes it possible to simplify the structure of molding dies for the outer casing 4 to which the lens 3 is integrated, making it possible to further reduce the molding cost. Further, forming one end of the cylindrical lens portion 13 into a hemispherical shape allows a light condensing ratio to be improved with the light condensed in the Y direction, making it possible to achieve a performance improvement.

Figure 3:
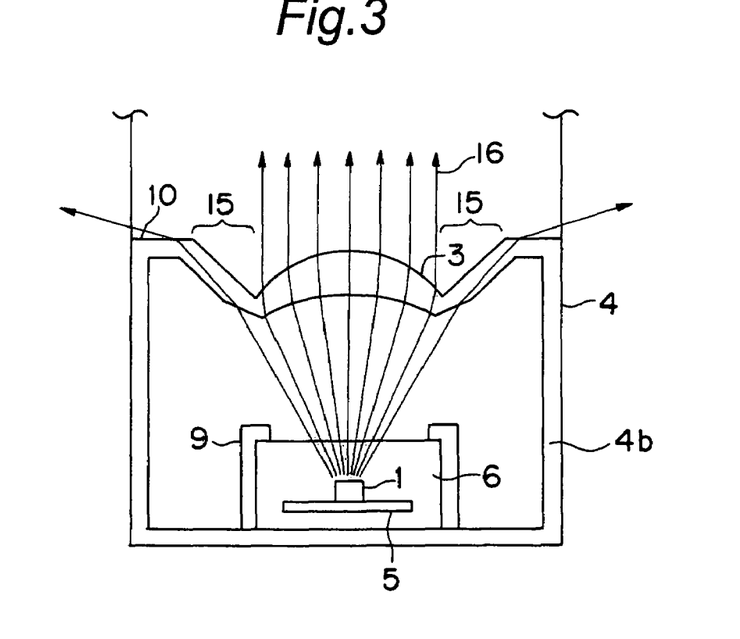
FIG. 3 is an enlarged view of a box member on a light emission side in an outer casing of FIG. 1.

FIG. 3 is an enlarged view of the box member 4b in the outer casing 4 in which the emission-side light-pervious resin 6 is housed. Referring to FIG. 3, an inclined portion 15 which is so inclined as to lower toward the lens 3 is provided around the lens 3 in the wall portion 10 that defines the disc passage 40. As a result of this, light emitted from the light emitting chip 1 so as to be incident on the inclined portion 15 is refracted and led outward (toward a direction for going away from the optical axis of the lens 3), and the light outputted from the inclined portion 15 is refracted further outward, thus being outputted outside of the outer casing 4. Accordingly, out of the light emitted from the light emitting chip 1, effective light alone can be collimated so as to form parallel rays 16. In this way, scattering of light or occurrence of aberrations in outer peripheral portions of the lens 3 can be reduced.

As shown above, in the optical encoder of this embodiment, light emitted from the light emitting chip 1 is collimated so as to form parallel rays 16. Therefore, scattering of light can be suppressed. In particular, even when the distance between the light emitting chip 1 and the light receiving chip 2 is longer than a reference value, incidence of disturbance light other than parallel rays onto the light receiving chip 2 can be suppressed by virtue of a synergistic effect of the collimation of light by the lens 3 and the collimation of light by the lengthened distance from the light emitting surface of the light emitting chip 1 to the light receiving surface of the light receiving chip 2. As a consequence, incidence characteristics of light onto the light receiving chip 2 can be stabilized.

Second Embodiment

An outlined construction of an optical encoder of this embodiment is generally similar to that of FIG. 1 of the first embodiment. Therefore, the same members as those of the first embodiment are designated by the same reference numerals, and differences in construction from the first embodiment are described below.

Figure 4:
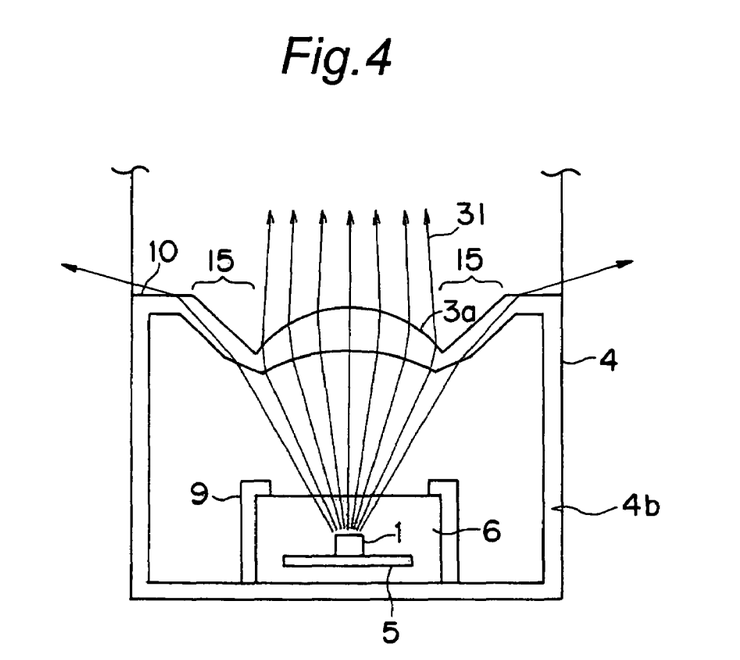
FIG. 4 is an enlarged view of a box member on a light emission side in an outer casing of an optical encoder different from that of FIG. 1.

FIG. 4 is an enlarged view of the box member 4b for housing therein the emission-side light-pervious resin 6 of the outer casing 4 in this embodiment. Referring to FIG. 4, a lens 3a is molded integrally with a wall portion 10 that defines a disc passage in the box member 4b of the outer casing 4 in which the emission-side light-pervious resin 6 is housed. Then, light emitted from the light emitting chip 1 and transmitted by the lens 3a travels as converging light 31 in this embodiment, passing through the opening 12 provided in the wall portion 11 facing the lens 3a in the box member 4a of the outer casing 4 in which the reception-side light-pervious resin 8 is housed, the light thus being incident on the light receiving chip 2 (refer to FIG. 1).

The inclined portion 15 has a function that, similar to that of the first embodiment, part of light which is emitted from the light emitting chip 1 and which has been incident on the inclined portion 15 is refracted so as to be directed outward (toward a direction for going away from the optical axis of the lens 3a), so that effective light alone is let to converge to form the converging light 31. In this way, scattering of light or occurrence of aberrations in outer peripheral portions of the lens 3a is reduced.

As shown above, the optical encoder of this embodiment is made up of three component parts, which are the emission-side light-pervious resin 6 by which the light emitting chip 1 is sealed, the reception-side light-pervious resin 8 by which the light receiving chip 2 is sealed, and the outer casing 4 to which the lens 3a is integrated and in which the emission-side light-pervious resin 6 and the reception-side light-pervious resin 8 are housed. Thus, the optical encoder can be reduced in parts count, allowing the development cost to be reduced, as compared with the case where the lens 3a for convergence of light derived from the light emitting chip 1 and the outer casing 4 are provided as independent component parts.

Further, in the optical encoder of this embodiment, light emitted from the light emitting chip 1 is let to converge to form the converging light 31. Therefore, diffusion of light can be suppressed. Further, the light condensing ratio can be improved, making it possible to achieve a performance improvement. In particular, even if the distance between the light emitting chip 1 and the light receiving chip 2 is shorter than a reference value, incidence of disturbance light onto the effective light receiving surface of the light receiving chip 2 can be suppressed. Consequently, incidence characteristics of light onto the light receiving elements can be stabilized.

Third Embodiment

An outlined construction of an optical encoder of this embodiment is generally similar to that of FIG. 1 of the first embodiment. Therefore, the same members as those of the first embodiment are designated by the same reference numerals, and differences in construction from the first embodiment are described below.

Figure 5:
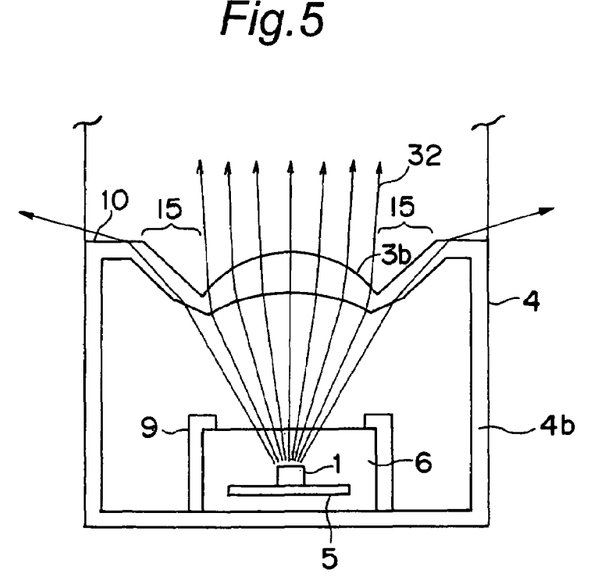
FIG. 5 is an enlarged view of a box member on a light emission side in an outer casing of an optical encoder different from those of FIGS. 1 and 4.

FIG. 5 is an enlarged view of the box member 4b for housing therein the emission-side light-pervious resin 6 in the outer casing 4 of this embodiment. Referring to FIG. 5, a lens 3b is molded integrally with a wall portion 10 that defines a disc passage in the box member 4b of the outer casing 4 in which the emission-side light-pervious resin 6 is housed. Then, light emitted from the light emitting chip 1 and transmitted by the lens 3b travels as diffused light 32 in this embodiment, passing through the opening 12 provided in the wall portion 11 facing the lens 3b in the box member 4a of the outer casing 4 in which the reception-side light-pervious resin 8 is housed, the light thus being incident on the light receiving chip 2 (refer to FIG. 1).

The inclined portion 15 has a function that, similar to that of the first embodiment, part of light emitted from the light emitting chip 1 which has been incident on the inclined portion 15 is refracted so as to be directed outward (toward a direction for going away from the optical axis of the lens 3b), so that effective light alone is diffused to form the diffused light 32. In this way, scattering of light or occurrence of aberrations in outer peripheral portions of the lens 3b is reduced.

As shown above, the optical encoder of this embodiment is made up of three component parts, which are the emission-side light-pervious resin 6 by which the light emitting chip 1 is sealed, the reception-side light-pervious resin 8 by which the light receiving chip 2 is sealed, and the outer casing 4 to which the lens 3b is integrated and in which the emission-side light-pervious resin 6 and the reception-side light-pervious resin 8 are housed. Thus, the optical encoder can be reduced in parts count, allowing the development cost to be reduced, as compared with the case where the lens 3b for diffusion of light derived from the light emitting chip 1 and the outer casing 4 are provided as independent component parts.

Further, in the optical encoder of this embodiment, light emitted from the light emitting chip 1 is diffused to form the diffused light 32. Therefore, even if the resolution of the light receiving chip 2 is lower than a reference value (i.e. the width of the effective light receiving surface of the light receiving chip 2 is wider than a reference value), the effective light receiving surface of the light receiving chip 2 can be irradiated uniformly with light. Consequently, incidence characteristics of light onto the light receiving chip 2 can be stabilized.

Fourth Embodiment

Figure 6:
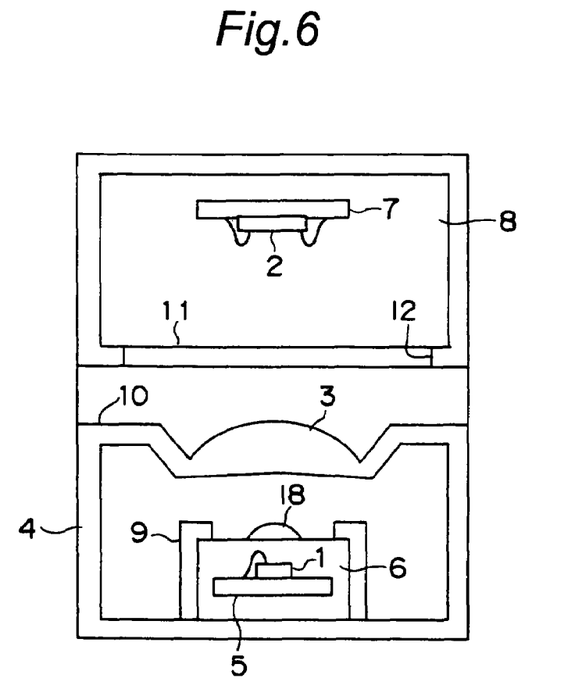
FIG. 6 is a longitudinal sectional view showing a schematic construction of an optical encoder different from those of FIGS. 1, 4 and 5.

FIG. 6 is a longitudinal sectional view showing a schematic construction of an optical encoder of this embodiment. Light emitting chip 1, light receiving chip 2, lens 3, outer casing 4, emission-side lead frame 5, emission-side light-pervious resin 6, reception-side lead frame 7, reception-side light-pervious resin 8, engagement member 9, wall portion 10, wall portion 11 and opening 12 in this embodiment are similar to those of the optical encoder of the first embodiment shown in FIG. 1. These component parts are designated by the same reference numerals as in FIG. 1 and their detailed description is omitted.

As shown in FIG. 6, in the optical encoder of this embodiment, on an optical axis of the light emitting chip 1 on one surface of the emission-side light-pervious resin 6 facing the lens 3, a convex lens 18 for condensing light derived from the light emitting chip 1 is provided by integral molding (transfer molding) with the emission-side light-pervious resin 6. In this way, the lens 3 integrated to the outer casing 4 and the convex lens 18 integrated to the emission-side light-pervious resin 6 are combined together, so that light emitted from the light emitting chip 1 can be collimated with more simplicity.

Fifth Embodiment

Figure 7:
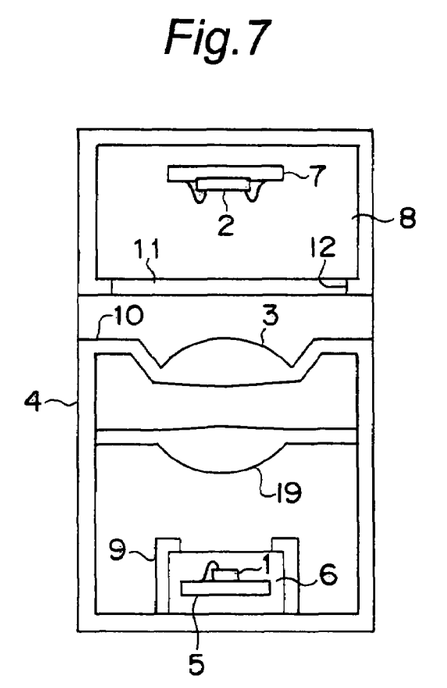
FIG. 7 is a longitudinal sectional view showing a schematic construction of an optical encoder different from those of FIGS. 1, 4, 5 and 6.

FIG. 7 is a longitudinal sectional view showing a schematic construction of an optical encoder of this embodiment. Light emitting chip 1, light receiving chip 2, lens 3, outer casing 4, emission-side lead frame 5, emission-side light-pervious resin 6, reception-side lead frame 7, reception-side light-pervious resin 8, engagement member 9, wall portion 10, wall portion 11 and opening 12 in this embodiment are similar to those of the optical encoder of the first embodiment shown in FIG. 1. These component parts are designated by the same reference numerals as in FIG. 1 and their detailed description is omitted.

As shown in FIG. 7, in the optical encoder of this embodiment, between the lens 3 and the emission-side light-pervious resin 6 in the outer casing 4 to which the lens 3 is integrated, a second lens 19 is provided by integral molding (transfer molding) with the outer casing 4. In this way, the plurality of lenses 3, 19 integrated to the outer casing 4 are provided so that light emitted from the light emitting chip 1 can be collimated with more simplicity. In this case, the first lens 3, which is a convex lens, and the second lens 19, which is a convex lens, are so arranged that their convex surfaces are opposite in direction to each other. Thus, as a further advantage, it becomes practicable to design a lens system which is capable of reducing the effects of aberrations.

Sixth Embodiment

Figure 8:
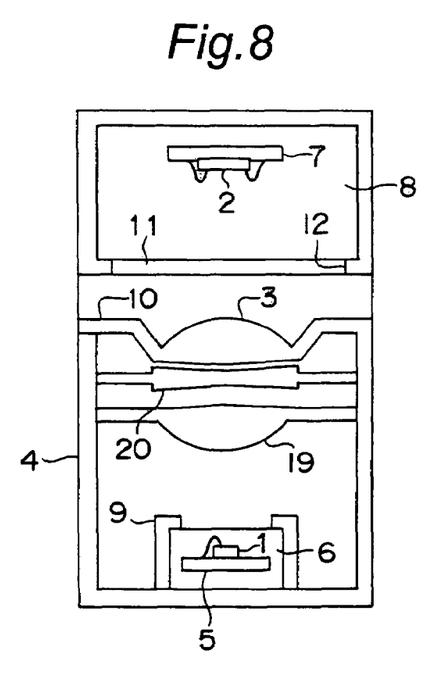
FIG. 8 is a longitudinal sectional view showing a schematic construction of an optical encoder different from those of FIGS. 1 and 4-7.

FIG. 8 is a longitudinal sectional view showing a schematic construction of an optical encoder of this embodiment. Light emitting chip 1, light receiving chip 2, lens 3, outer casing 4, emission-side lead frame 5, emission-side light-pervious resin 6, reception-side lead frame 7, reception-side light-pervious resin 8, engagement member 9, wall portion 10, wall portion 11 and opening 12 in this embodiment are similar to those of the optical encoder of the first embodiment shown in FIG. 1. These component parts are designated by the same reference numerals as in FIG. 1 and their detailed description is omitted.

In the optical encoder of this embodiment, as shown in FIG. 8, between the lens 3 and the emission-side light-pervious resin 6 in the outer casing 4 to which the lens 3 is integrated, a second lens 19 is provided by integral molding with the outer casing 4 as in the case of the optical encoder of the fifth embodiment shown in FIG. 7. The first lens 3, which is a convex lens, and the second lens 19, which is a convex lens, are so arranged that their convex surfaces are opposite in direction to each other.

Furthermore, in this embodiment, between the first lens 3 and the second lens 19 in the outer casing 4, a concave lens 20 as a third lens can be inserted from outside the outer casing 4. By such an arrangement, the effects of aberrations can be further reduced, as compared with the case of the optical encoder of the fifth embodiment.

The above description has been given, as an example, on a case where an additional lens comprised of the concave lens 20 is inserted from outside the outer casing 4 to between a plurality of lenses comprised of the first, second lenses 3, 19, which are formed integrally with the outer casing 4. However, the present invention is not limited to this, and it may also be arranged without any problem that an additional lens can be inserted from outside the outer casing 4, for example, on the incidence side of one lens 3 formed integrally with the outer casing 4. Besides, the type of the lens to be inserted from outside the outer casing 4 is also not limited to the concave lens.

Seventh Embodiment

Figure 9:
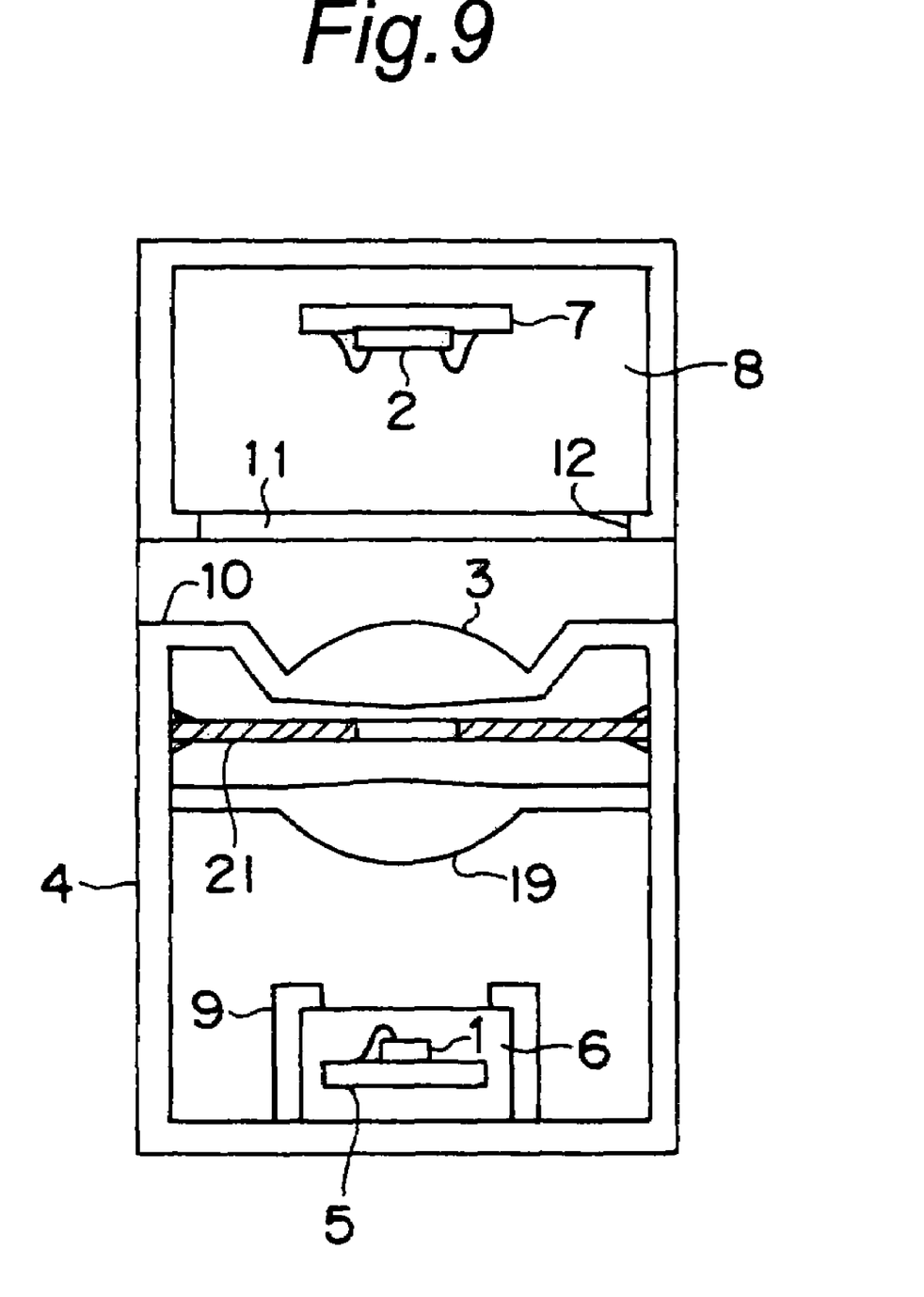
FIG. 9 is a longitudinal sectional view showing a schematic construction of an optical encoder different from those of FIGS. 1 and 4-8.

FIG. 9 is a longitudinal sectional view showing a schematic construction of an optical encoder of this embodiment. Light emitting chip 1, light receiving chip 2, lens 3, outer casing 4, emission-side lead frame 5, emission-side light-pervious resin 6, reception-side lead frame 7, reception-side light-pervious resin 8, engagement member 9, wall portion 10, wall portion 11 and opening 12 in this embodiment are similar to those of the optical encoder of the first embodiment shown in FIG. 1. These component parts are designated by the same reference numerals as in FIG. 1 and their detailed description is omitted.

In the optical encoder of this embodiment, as shown in FIG. 9, between the lens 3 and the emission-side light-pervious resin 6 in the outer casing 4 to which the lens 3 is integrated, a second lens 19 is provided by integral molding with the outer casing 4 as in the case of the optical encoder of the fifth embodiment shown in FIG. 7. The first lens 3, which is a convex lens, and the second lens 19, which is a convex lens, are so arranged that their convex surfaces are opposite in direction to each other.

Furthermore, in this embodiment, between the first lens 3 and the second lens 19 in the outer casing 4, a slit 21 can be inserted from outside the outer casing 4. By such an arrangement, only part of light emitted from the light emitting chip 1 that is close to and parallel to the optical axis can be made to be incident on the first lens 3 by the slit 21, thus making it possible to make up a telecentric optical system.

Figure 10:
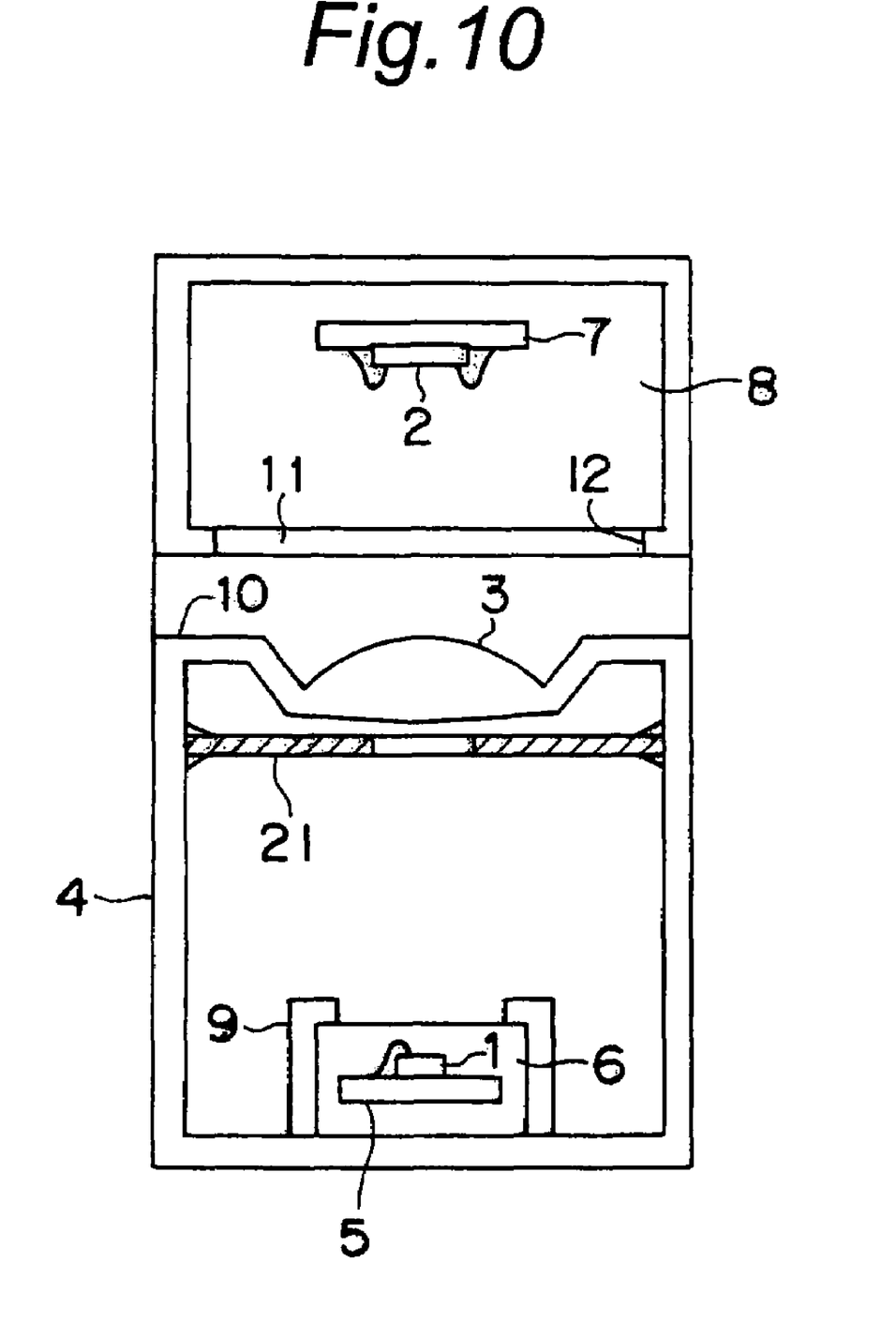
FIG. 10 is a longitudinal sectional view showing a schematic construction of an optical encoder different from those of FIGS. 1 and 4-9.

The above description has been given, as an example, on a case where the slit 21 is inserted from outside the outer casing 4 to between a plurality of lenses comprised of the first, second lenses 3, 19, which are formed integrally with the outer casing 4. However, the present invention is not limited to this, and it may also be arranged without any problem that, as shown in FIG. 10, a slit 21 can be inserted from outside the outer casing 4, for example, on the incidence side of one lens 3 formed integrally with the outer casing 4.

In the foregoing embodiments described above, the outer casing 4, to which the lens 3 is integrated, is formed from a resin that allows only light of a particular wavelength emitted from the light emitting chip 1 to pass therethrough. As a result of this, any effects of disturbance light of other wavelengths that is transmitted by the outer casing 4 to come in can be reduced.

The foregoing embodiments have been described, as an example, on a case of a transmission encoder in which rotational speed, rotational direction, rotational position and the like of a disc, which is a detection object, are detected based on light that has been transmitted by the disc. However, the present invention is not limited to transmission type encoders, but can also be applied to reflection type encoders.

Furthermore, in the foregoing embodiments, it is also allowable that a lens for condensing parallel light derived from the lens 3 is placed on the incidence side of the light receiving chip 2.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An optical encoder comprising:
   a light emitting element;
   a light receiving element for receiving light derived from the light emitting element and transmitted or reflected by a detection object;
   a lens for applying the light, which has been emitted from the light emitting element, to the detection object; and
   a casing for housing therein the light emitting element and the light receiving element and fixing the light emitting element and the light receiving element to specified positions, the casing defining a passage, between the specified positions, that allows the detection object to pass therethrough, wherein
   the casing and the lens are integrally molded by a light-pervious resin.

2. The optical encoder as claimed in claim 1, wherein
   the light receiving element receives the light derived from the light emitting element and transmitted by the detection object,
   the light emitting element is sealed by an emission-side light-pervious resin,
   the light receiving element is sealed by a reception-side light-pervious resin, and
   the casing includes a first box member housing therein the emission-side light-pervious resin and a second box member housing therein the reception-side light-pervious resin.

3. The optical encoder as claimed in claim 1, wherein
   the lens makes the light, which has been emitted from the light emitting element, formed into parallel light and applied to the detection object.

4. The optical encoder as claimed in claim 1, wherein
   the lens makes the light, which has been emitted from the light emitting element, formed into converging light and applied to the detection object.

5. The optical encoder as claimed in claim 1, wherein
   the lens makes the light, which has been emitted from the light emitting element, formed into diffused light and applied to the detection object.

6. The optical encoder as claimed in claim 1, wherein
   the lens has a cylindrical lens portion having a cylindrical shape.

7. The optical encoder as claimed in claim 6, wherein
   the lens has a hemispherical lens portion having a hemispherical shape formed integrally with at least one of both ends of the cylindrical lens portion.

8. The optical encoder as claimed in claim 6, wherein
   around the lens, an inclined portion is provided, the inclined portion being so inclined as to lower toward the lens, and to refract its incident light toward a direction in which the light goes away from an optical axis of the lens so that the light is led to go away from the optical axis, and to refract its outgoing light toward a direction in which the light goes further away from the optical axis.

9. The optical encoder as claimed in claim 1, wherein
   the casing with which the lens is integrally molded is formed from a light-pervious resin that allows only light of a particular wavelength to be transmitted therethrough.

10. The optical encoder as claimed in claim 1, wherein
    the light emitting element is sealed by a light-pervious resin, and
    a second lens for condensing light emitted from the light emitting element is integrally molded with one surface, through which the light emitted from the light emitting element passes, of the light-pervious resin by which the light emitting element is sealed.

11. The optical encoder as claimed in claim 1, wherein
    the lens integrally molded to the casing is provided at least one in quantity.

12. The optical encoder as claimed in claim 11, wherein
    the casing is so arranged that in addition to having the integrally molded at least one lens, another lens is additionally inserted from outside.

13. The optical encoder as claimed in claim 11, wherein
    the casing is so arranged that in addition to having the integrally molded at least one lens, a slit is additionally inserted from outside.

14. Electronic equipment which uses the optical encoder as claimed in claim 1.

15. The optical encoder as claimed in claim 2, wherein
    the first box member defines an open space therein, and
    the second box member is completely filled with the reception-side light-pervious resin.

16. The optical encoder as claimed in claim 2, wherein
    the first box member is provided outside the second box member.

* * * * *